US012804955B2

(12) United States Patent
Barlage et al.

(10) Patent No.: US 12,804,955 B2
(45) Date of Patent: Nov. 17, 2026

(54) TRANSISTORS WITH TIN OXIDE SEMICONDUCTOR

(71) Applicant: Zinite Corporation, Vancouver (CA)

(72) Inventors: Douglas Barlage, Edmonton (CA); Fenglin Liu, Edmonton (CA); Gem Shoute, Edmonton (CA); Alex Ma, Edmonton (CA)

(73) Assignee: Zinite Corporation, Vancouver (CA)

(*) Notice: Subject to any disclaimer, the term of this patent is extended or adjusted under 35 U.S.C. 154(b) by 0 days.

(21) Appl. No.: 19/300,315

(22) Filed: Aug. 14, 2025

(65) Prior Publication Data

US 2026/0052736 A1 Feb. 19, 2026

Related U.S. Application Data

(60) Provisional application No. 63/682,985, filed on Aug. 14, 2024.

(51) Int. Cl.
*H10D 30/67* (2025.01)
*H10D 30/01* (2025.01)

(52) U.S. Cl.
CPC ....... *H10D 30/6755* (2025.01); *H10D 30/031* (2025.01); *H10D 30/6757* (2025.01); *H10D 30/6731* (2025.01); *H10D 30/6734* (2025.01)

(58) Field of Classification Search
CPC ........... H10D 30/6755; H10D 30/6757; H10D 30/6731; H10D 30/6734; H10D 30/031
See application file for complete search history.

(56) References Cited

U.S. PATENT DOCUMENTS 6,608,326 B1 * 8/2003 Shinagawa ............. H10P 14/24 257/70
7,211,825 B2 * 5/2007 Shih ................... H10D 30/6755 257/66

(Continued)

FOREIGN PATENT DOCUMENTS

CN 101312912 A * 11/2008 ......... H10D 30/6755
CN 101339959 A * 1/2009 ......... H10D 30/6755

(Continued)

OTHER PUBLICATIONS

Muntaser Al-Mansoori et al., Effects of gas flow rate on the structure and elemental composition of tin oxide thin films deposited by RF sputtering, Dec. 5, 2017, AIP Advances 7, 125105 (2017). (Year: 2017).*

(Continued)

*Primary Examiner* — Ida M Soward
(74) *Attorney, Agent, or Firm* — McAndrews, Held & Malloy, Ltd.; Michael S. Tomsa

(57) ABSTRACT

There is described a thin-film transistor (TFT) and a method for production thereof. The TFT can include: a substrate; a source disposed at the substrate; a drain disposed at the substrate; a gate; and a thin film of tin oxide disposed within the influence of the gate between the source and the drain, the thin film of tin oxide to form a carrier channel between the source and the drain when sufficient voltage is applied at the gate. Advantageously, the thin film of tin oxide has carrier concentration of less than or equal to 1.0×1019 $cm^{-3}$ and a mobility of greater than or equal to 100 $cm^2/V{\cdot}s$.

13 Claims, 7 Drawing Sheets

(56) References Cited

U.S. PATENT DOCUMENTS

| | | | | |
|---|---|---|---|---|
| 7,262,463 | B2 | 8/2007 | Hoffman | |
| 7,564,055 | B2 | 7/2009 | Hoffman | |
| 8,940,562 | B1 | 1/2015 | Li | |
| 9,224,598 | B2 | 12/2015 | Choi et al. | |
| 9,478,666 | B2 * | 10/2016 | Kwon | H10D 99/00 |
| 11,316,048 | B2 | 4/2022 | Sung et al. | |
| 11,949,019 | B2 | 4/2024 | Barlage et al. | |
| 2005/0017302 | A1 * | 1/2005 | Hoffman | H10D 30/751 438/149 |
| 2009/0283763 | A1 * | 11/2009 | Park | H10D 30/6715 257/E29.296 |
| 2010/0065844 | A1 * | 3/2010 | Tokunaga | H10D 30/6755 257/E29.296 |
| 2013/0092931 | A1 * | 4/2013 | Knutson | H10D 30/6757 257/43 |
| 2013/0187154 | A1 * | 7/2013 | Uchiyama | H10D 30/6756 257/43 |
| 2014/0346498 | A1 * | 11/2014 | Ahn | H10D 30/6723 257/43 |
| 2020/0321469 | A1 * | 10/2020 | Hayashi | H01L 21/0217 |

FOREIGN PATENT DOCUMENTS

| | | | | | |
|---|---|---|---|---|---|
| CN | 107731930 | A | * | 2/2018 | H10D 48/031 |
| CN | 207282498 | U | * | 4/2018 | H10D 30/67 |
| CN | 109742152 | A | * | 5/2019 | H10P 14/6514 |
| CN | 109887991 | A | * | 6/2019 | H10P 95/90 |
| CN | 109935637 | A | | 6/2019 | |
| CN | 112086519 | A | * | 12/2020 | H10D 99/00 |
| CN | 117976544 | A | * | 5/2024 | H10P 95/90 |
| CN | 118486737 | A | * | 8/2024 | H10P 10/00 |
| JP | 2002246606 | A | * | 8/2002 | H10D 30/663 |
| KR | 20150111193 | A | * | 10/2015 | H10D 30/6757 |
| KR | 20160005946 | A | * | 1/2016 | H10P 14/24 |
| KR | 20190012498 | A | * | 2/2019 | H10D 86/40 |
| WO | WO-2020101164 | A1 | * | 5/2020 | H10P 95/90 |

OTHER PUBLICATIONS

Cao et al., Tin oxide-based thin-film transistors and their circuits; Tin Oxide Materials: Synthesis, Properties, and Applications, https://doi.org/10.1016/B978-0-12-815924-8.00015-3, © 2020 Elsevier Inc. (pp. 441-476).

Cheng et al., Morphology, composition and electrical properties of SnO2:CI thin films grown by atomic layer deposition by Cheng et al., 01A112-1 J. Vac. Sci. Technol. A 34(1), Jan./Feb. 2016 0734-2101/2016/34(1)/01A112/6/$30.00 VC 2015 American Vacuum Society 01A112-1 (6 pages).

Choi et al., The conducting tin oxide thin films deposited via atomic layer deposition using Tetrakis-dimethylamino tin and peroxide for transparent flexible electronics by Choi et al., http://dx.doi.org/10.1016/j.apsusc2014.06.0270169-4332/© 2014 Elsevier B.V., Applied Surface Science 313 (2014) 585-590 (6 pages).

Huang, et al., Deposition Mechanism and Characterization of Plasma-Enhanced Atomic Layer-Deposited SnOx Films at Different Substrate Temperatures, Nanomaterials 2022, 12, 2859. https://doi.org/10.3390/nano12162859 https://www.mdpi.com/journal/nanomaterials (16 pages).

Islam, et al., Electron affinity and work function of polycrystalline Sn02 thin film, Journal of Materials Science Letters 5, © 1986 Chapman and Hall Ltd., (pp. 63-65).

Klasens, A tin oxide field-effect transistor, Solid-State Electronics Pergamon Press 1964. vol. 7, pp. 701-702. Printed in Great Britain (2 pages).

Lee, et al., Physical/chemical properties of tin oxide thin film transistors prepared using plasma-enhanced atomic layer deposition, Materials Research Bulletin 47, © 2012 (pp. 3052-3055).

Moholkar, et al., Effect of fluorine doping on highly transparent conductive spray deposited nanocrystalline tin oxide thin films, © 2009 Elsevier B.V., Applied Surface Science 255 (2009) (pp. 9358-9364).

Muneshwar, et al., Tetraallyltin precursor for plasma enhanced atomic layer deposition of tin oxide: Growth study and material characterization, 030601-1 J. Vac. Sci. Technol. A 37(3), May/Jun. 2019 0734-2101/2019/37(3)/030601/6/$30.00 Published by the AVS. 030601-1 (6 pages).

Pooja, et al., Outstanding High Field-Effect Mobility of 299 cm2 V-1 s-1 by Nitrogen-Doped SnO2 Nanosheet Thin-Film Transistor, Adv. Mater. Technol. 2023, 8, 2201521, © 2023 Wiley-VCH GmbH (10 pages).

Saji, et al., Tin Oxide Based p. and N-Type Thin Film Transistors Developed by RF Sputtering, ECS Journal of Solid State Science and Technology, 4 (9) Q101-Q104 (2015) (pp. 101-104).

Won et al., Effect of Oxygen Source on the Various Properties of SnO2 Thin Films Deposited by Plasma-Enhanced Atomic Layer Deposition, Coatings 2020, 10, 692; doi: 10.3390/coatings10070692 www.mdpi.com/journal/coatings (10 pages).

Yoon, et al., Electrical Characteristics of Tin Oxide Films Grown by Thermal Atomic Layer Deposition, Arch. Metall. Mater. 65 (2020), 3, (pp. 1041-1044).

Xu, et al., Comparison of thermal, plasma-enhanced and layer by layer Ar plasma treatment atomic layer deposition of Tin oxide thin films, Journal of Crystal Growth 572 (2021) 126264 (5 pages).

Won, et al., Polycrystalline and high purity SnO2 films by plasma-enhanced atomic layer deposition using H2O plasma at very low temperatures of 60-90 °C, Vacuum 196 (2022) 110739, 0042-207X/ © 2021 Elsevier Ltd. (6 pages).

International Search Report and Written Opinion dated Oct. 16, 2025, in International application No. PCT/CA2025/051063 (8 pages).

* cited by examiner

TRANSISTORS WITH TIN OXIDE SEMICONDUCTOR

RELATED APPLICATION

The present application claims priority to U.S. Provisional Patent Application No. 63/682,985, filed Aug. 14, 2024, and entitled "Transistors with Tin Oxide Semiconductor," which is hereby incorporated by reference in its entirety.

FIELD

The present disclosure relates to thin films, related thin-film active devices and methods for production of thin films and related thin-film active devices.

BACKGROUND

Silicon-based chips, often referred to as integrated circuits (ICs) or microchips, are fundamental components in modern electronics.

Silicon is the primary material used in the manufacture of most semiconductor chips due to its abundance, cost-effectiveness, and excellent electrical properties.

Chips are made by creating intricate patterns of transistors and other electronic components on thin slices of silicon called wafers.

Silicon chips serve as the 'brains' of electronic devices, processing and storing information.

They are found in a wide range of products, including computers, smartphones, household appliances, cars, and industrial machinery.

The are various types of chips.

- Microprocessors: these handle the main processing tasks in computers and other devices.
- Memory chips: these store data temporarily (RAM) or permanently (flash memory).
- Application-Specific Integrated Circuits (ASICs): these are custom-designed for specific tasks.
- System on a Chip (SoC): these integrate multiple components (CPU, GPU, memory) onto a single chip, commonly used in mobile devices.

Conventionally, silicon-based chips are produced using a process that involves photolithography, doping, etching, and layering to create millions or even billions of transistors on a single chip.

The scale of these features is measured in nanometres (nm), with modern chips using processes with feature definition as small as 3 nm or 5 nm.

Silicon-based chips, such as those used in CPUs, GPUs, and memory devices, are traditionally manufactured as flat, two-dimensional structures. Stacking these chips during the manufacturing process presents several significant challenges.

Manufacturing silicon chips requires high temperatures—e.g., 1000° C. While silicon-based transistors are made at elevated temperatures like this, other components of a chip, such as wiring, are made at lower temperatures and may be damaged or destroyed at the temperatures required for silicon-based transistors. Hence, silicon-based devices cannot be readily stacked within a chip because the high temperatures required to make the second and subsequent layer of silicon-based transistors would damage or destroy other components, such as wiring, located at previously formed lower layers.

Thus, while stacking silicon-based devices during the manufacturing process could, in theory, increase performance and density, the practical challenges—especially related to thermal budget—make it unfeasible with current technology. Accordingly, stacking is generally reserved for later stages (i.e., chiplets) rather than during initial chip fabrication.

Thin film transistors (TFTs) are a type of field-effect transistor where the active semiconductor layer, as well as the dielectric layer and metallic contacts, are deposited as thin films on a substrate. While TFTs are most commonly associated with display technologies (such as LCDs and OLEDs), their potential to be stacked in three dimensions within a chip itself is an area of growing interest, particularly as the demand for higher performance and greater integration in electronic devices increases.

However, the use of TFTs in the manufacture of three-dimensional chips has not been successfully achieved due to limitations associated with conventional TFTs.

Carrier Mobility Limitations

Conventional TFTs are typically fabricated using polycrystalline or amorphous materials (such as amorphous silicon, polycrystalline silicon, or metal oxides). These materials have a higher density of defects, grain boundaries, and disordered structures compared to single-crystal silicon, which significantly reduces carrier mobility.

The presence of grain boundaries, impurities, and interface states in conventional TFTs leads to increased scattering of charge carriers, further lowering mobility.

Carrier mobility in conventional thin films is often more sensitive to temperature changes, as thermal vibrations can exacerbate scattering effects.

The thinness of the active layer in conventional thin films and TFTs can also limit mobility due to increased surface and interface scattering.

Carrier Concentration Limitations

Achieving precise and uniform doping in conventional TFTs is more difficult than in bulk materials. Non-uniform doping can lead to variability in device performance and limit the maximum achievable carrier concentration.

Conventional TFTs often contain a high density of trap states (defects or impurities that can capture carriers), which can reduce the effective carrier concentration available for conduction.

In conventional TFTs, the gate electrode modulates the carrier concentration in the channel. However, the maximum carrier concentration is limited by the gate dielectric's breakdown strength and the capacitance of the gate insulator.

Some materials used in conventional TFTs, such as amorphous silicon, inherently support lower carrier concentrations due to their electronic structure and the presence of localized states.

U.S. Pat. No. 11,949,019B2 to Barlage et al. ("Barlage") describes a thin-film semiconductor switching device. While Barlage represents a significant advance in the art, there is room for at least some improvement, particularly in the manufacture of three-dimensional chips (i.e., those with stacked layers of transistors).

In summary, conventional thin film transistors are limited in carrier mobility primarily due to material disorder, grain boundaries, and interface effects, while carrier concentration is constrained by doping difficulties, trap states, and gate dielectric properties. These limitations are significant impediments implementation of conventional TFTs in the manufacture of true 3D chips.

Thus, there remains need in the art for an improved TFT that obviates or mitigates the above-mentioned limitations of conventional TFTs. Such an improved TFT would, for example, increase or realize the potential of incorporating TFTs in the manufacture of true 3D chips.

SUMMARY

The present disclosure generally relates to a thin-film transistor, substantially as illustrated by and described in connection with at least one of the figures, as set forth more completely in the claims.

It is an object of the present disclosure to obviate or mitigate at least one of the above-mentioned disadvantages of the prior art.

It is another object of the present disclosure to provide a novel thin-film transistor.

It is yet another object of the present disclosure to provide a method of forming a thin-film transistor.

It is yet another object of the present disclosure to provide a thin-film of tin oxide.

Accordingly, in one of its aspects, the present disclosure provides a thin-film transistor comprising: a substrate; a source disposed at the substrate; a drain disposed at the substrate; a gate; and a thin film of tin oxide disposed within the influence of the gate between the source and the drain, the thin film of tin oxide to form a carrier channel between the source and the drain when sufficient voltage is applied at the gate; wherein the thin film of tin oxide has carrier concentration of less than or equal to $1.0\times10^{19}$ $cm^{-3}$ and a mobility of greater than or equal to 100 $cm^2/V\cdot s$.

In another of its aspects, the present disclosure provides a thin-film transistor that comprises a substrate, a source disposed on the substrate, a drain disposed on the substrate, a gate, and a thin film of tin oxide disposed within the influence of the gate between the source and the drain. The thin film of tin oxide forms a carrier channel between the source and the drain when sufficient voltage is applied to the gate. The thin film of tin oxide has a preferred crystallite orientation of Miller index <110>.

In another of its aspects, the present disclosure provides a method of forming a thin-film transistor comprises forming a thin film of tin oxide as a channel material between a source and drain using plasma-enhanced atomic layer deposition (PEALD) using tetraallyltin as precursor with oxygen plasma.

In yet another of its aspects, the present disclosure provides a method of forming a thin-film transistor comprising: forming a thin film of tin oxide as a channel material between a source and a drain using atomic layer deposition (ALD) with a substrate temperature in the range of from about 150° C. to about 220° C.; wherein the thin film of tin oxide has carrier concentration of less than or equal to $1.0\times10^{19}$ $cm^{-3}$ and a mobility of greater than or equal to 100 $cm^2/V\text{–}s$.

In yet another of its aspects, the present disclosure provides a thin film of tin oxide having a carrier concentration of less than or equal to $1.0\times10^{19}$ $cm^{-3}$ and a mobility of greater than or equal to 100 $cm^2/V\cdot s$.

In yet another of its aspects, the present disclosure provides a method of forming a thin film comprising: forming a thin film of tin oxide using atomic layer deposition (ALD); wherein the thin film of tin oxide has carrier concentration of less than or equal to $1.0\times10^{19}$ $cm^{-3}$ and a mobility of greater than or equal to 100 $cm^2/V\cdot s$.

In yet another of its aspects, the present disclosure provides a thin-film transistor comprising: a substrate; a source disposed at the substrate; a drain disposed at the substrate; a gate; and a thin film of tin oxide disposed within the influence of the gate between the source and the drain, the thin film of tin oxide to form a carrier channel between the source and the drain when sufficient voltage is applied at the gate; wherein the thin film of tin oxide as an XRD pattern having (a) a main characteristic peak at 26.59° (2θ) and (b) a shoulder peak at 25° (2θ), wherein the intensity of (b) is less than or equal to about 35% of the intensity of (a).

In yet another of its aspects, the present disclosure provides a thin film of tin oxide having an XRD pattern having (a) a main characteristic peak at 26.59° (2θ) and (b) a shoulder peak at 25° (2θ), wherein the intensity of (b) is less than or equal to about 35% of the intensity of (a).

In yet another of its aspects, the present disclosure provides a thin-film transistor comprising: a substrate; a source disposed at the substrate; a drain disposed at the substrate; a gate; and a thin film of tin oxide disposed within the influence of the gate between the source and the drain, the thin film of tin oxide to form a carrier channel between the source and the drain when sufficient voltage is applied at the gate; wherein the thin film of tin oxide as an XRD pattern substantially the same as that in FIG. 3A or in FIG. 3B.

In yet another of its aspects, the present disclosure provides a thin film of tin oxide having an XRD pattern substantially the same as that in FIG. 3A or FIG. 3B.

Thus, the present inventors have been able to address the problems associated with conventional thin film transistors which are limited by (1) carrier mobility primarily due to material disorder, grain boundaries, and interface effects, and (2) carrier concentration constraints due to doping difficulties, trap states, and gate dielectric properties. By obviating and/or mitigating these limitations, the present TFTs increase or realize the potential of incorporating TFTs in the manufacture of 3D chips formed of stacked layers of transistors and wiring.

The present inventors have unexpectedly discovered that that an improved TFT can be produced if the tin oxide layer is formed on a substrate at the temperature in the range of from about 150° C. to about 220° C. By forming the tin oxide layer at this temperature, the resulting tin oxide has a unique XRD pattern having (a) a main characteristic peak at 26.59° (2θ) and (b) a shoulder peak at 25° (2θ), wherein the intensity of (b) is less than or equal to about 35% of the intensity of (a). Preferably, the intensity of (b) is in the range of from about 25% to about 35% of the intensity of (a).

In addition, the present inventors have unexpectedly discovered it is possible to obviate or mitigate breakdown of the source-channel interfacial member when the TFT taught in Barlage (thereby retaining the advantage of having them) is used in a stacked chip architecture by forming the tin oxide layer in the manner described in the preceding paragraph. Advantageously, the deposited tin oxide layer can be used to produce a TFT having a very desirable combination of carrier mobility and carrier concentration.

More specifically, the present inventors have further unexpectedly discovered that a thin film of tin oxide with a very desirable combination of carrier mobility (relatively high) and carrier concentration (relatively low) can be produced when a stoichiometric excess of oxygen ($O_2$) is present during the manufacturing process. The use of such thin films in a TFT allows for the TFTs of the present disclosure to be applied in stacked chip architectures in a manner not achieved heretofore to the knowledge of the present inventors.

While not wish to be bound by any particular theory or mode of action, it is believed the observed increase in mobility is associated with the state of the channel when the channel material is initially deposited. The channel in this state is believed to be relatively rich in oxygen. Without accounting for this extra oxygen would likely contribute to mobility reduction by adding extra scattering effects. However, in a preferred embodiment, annealing in any environment is believed to allow for the highly mobile extra oxygen to settle into the vacancies and reduce the number of vacancies and thus the number of free electrons. The present inventors have observed capacitance data pre-and post-annealing confirm this effect. The device mobility and peak current for a given overdrive voltage can increase as much as 10-fold or more with post processing annealing. The lower free electron concentration (non-accumulation electrons) and the number of extra oxygen sites decrease in a way to significantly enhance the available drive current.

Interlayer Signal Routing and Switching

In stacked silicon-based chips, multiple layers of active devices are integrated vertically to increase functionality and density. The TFTs of the present disclosure can be fabricated on interposer layers or directly on insulating layers between silicon dies. They serve as switches or signal routing elements, enabling communication between different layers without the need for complex through-silicon vias (TSVs).

3D Integration and Monolithic Stacking

TFTs of the present disclosure are particularly useful in monolithic 3D integration, where additional device layers are built on top of a base silicon wafer or other primary substrate. Because TFTs of the present disclosure can be fabricated at relatively low temperatures, they can be deposited on top of existing circuitry without damaging the underlying wiring and silicon devices. This allows for the creation of logic or memory layers above the primary substrate, enhancing chip functionality and density.

Memory and Logic Integration

In some advanced memory architectures, such as 3D NAND flash, the TFTs of the present disclosure are used as access transistors within the memory stack. Their thin-film nature allows for the creation of vertical memory cells, where the control transistors are integrated into the stack itself, reducing the overall footprint and increasing storage density.

Reduction of Parasitic Capacitance

By using TFTs of the present disclosure for certain switching and routing functions in stacked chips, it is possible to reduce parasitic capacitance and improve signal integrity. This is particularly important as device dimensions shrink and interconnect lengths increase in 3D architectures.

Advantages of Using the Present TFTs in Stacked Chips

Low-Temperature Processing: TFTs of the present disclosure can be fabricated at lower temperatures compared to traditional bulk silicon transistors, making them suitable for integration on top of completed silicon circuits.

Scalability: TFTs of the present disclosure enable the stacking of multiple functional layers, supporting the trend towards higher integration and miniaturization in electronics.

BRIEF DESCRIPTION OF THE DRAWINGS

The foregoing and other objects, features, and advantages of the devices, systems, and methods described herein will be apparent from the following description of particular examples thereof, as illustrated in the accompanying figures; where like or similar reference numbers refer to like or similar structures. The figures are not necessarily to scale, emphasis instead being placed upon illustrating the principles of the devices, systems, and methods described herein.

DETAILED DESCRIPTION

References to items in the singular should be understood to include items in the plural, and vice versa, unless explicitly stated otherwise or clear from the text. Grammatical conjunctions are intended to express any and all disjunctive and conjunctive combinations of conjoined clauses, sentences, words, and the like, unless otherwise stated or clear from the context. Recitation of ranges of values herein are not intended to be limiting, referring instead individually to any and all values falling within and/or including the range, unless otherwise indicated herein, and each separate value within such a range is incorporated into the specification as if it were individually recited herein. In the following description, it is understood that terms such as “first,” “second,” “top,” “bottom,” “side,” “front,” “back,” and the like are words of convenience and are not to be construed as limiting terms. For example, while in some examples a first side is located adjacent or near a second side, the terms “first side” and “second side” do not imply any specific order in which the sides are ordered.

The terms “about,” “approximately,” “substantially,” or the like, when accompanying a numerical value, are to be construed as indicating a deviation as would be appreciated by one of ordinary skill in the art to operate satisfactorily for an intended purpose. Ranges of values and/or numeric values are provided herein as examples only, and do not constitute a limitation on the scope of the disclosure. The use of any and all examples, or exemplary language ("e.g.," "such as," or the like) provided herein, is intended merely to better illuminate the disclosed examples and does not pose a limitation on the scope of the disclosure. The terms "e.g.," and "for example" set off lists of one or more non-limiting examples, instances, or illustrations. No language in the specification should be construed as indicating any unclaimed element as essential to the practice of the disclosed examples.

The term "and/or" means any one or more of the items in the list joined by "and/or." As an example, "x and/or y" means any element of the three-element set {(x), (y), (x, y)}. In other words, "x and/or y" means "one or both of x and y". As another example, "x, y, and/or z" means any element of the seven-element set {(x), (y), (z), (x, y), (x, z), (y, z), (x, y, z)}. In other words, "x, y, and/or z" means "one or more of x, y, and z."

Figure 1:
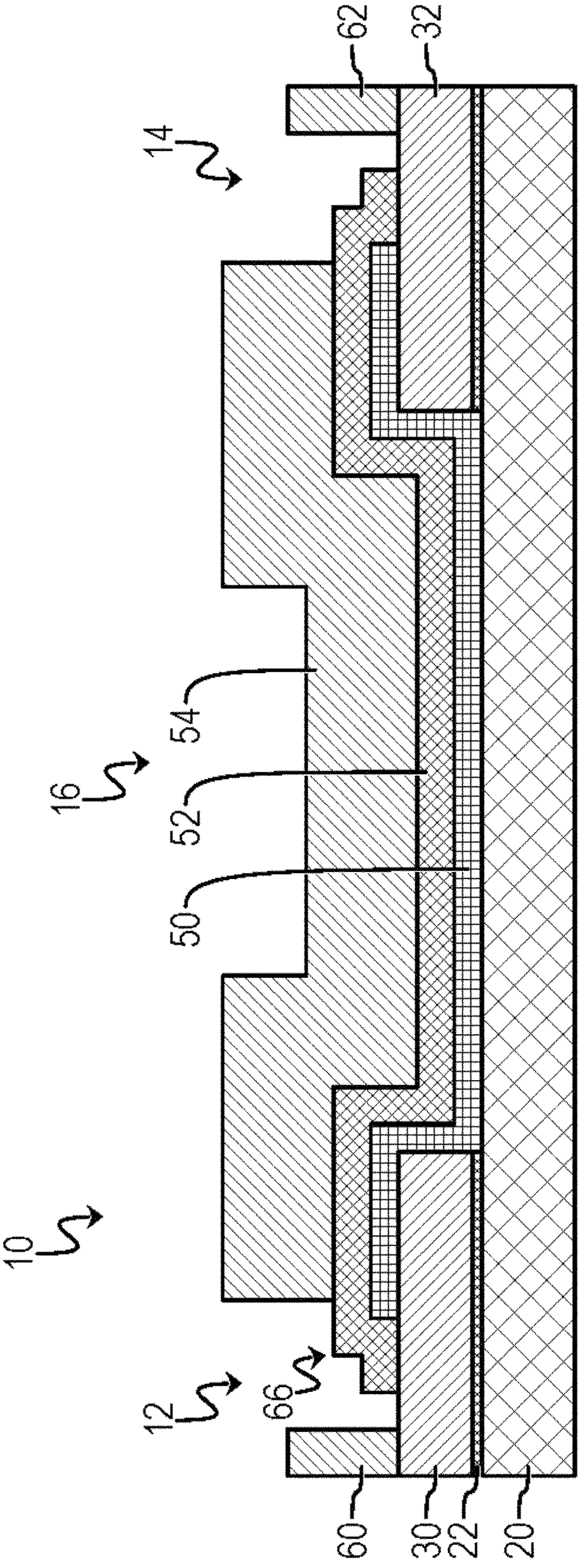
FIG. 1 is a cross-sectional view of an example thin-film transistor with a tin oxide semiconductor layer according to the present disclosure.

FIG. 1 shows an example TFT 10 according to the present disclosure. The TFT 10 includes a source 12, drain 14, and gate 16.

The TFT 10 is formed with a planar substrate 20. The substrate 20 may be disposed over another layer of TFTs, whether manufactured in accordance with the present disclosure or by another technique, or over a layer of complementary metal-oxide-semiconductor (CMOS) devices or other front end of line (FEOL) devices. In some embodiments, the TFT 10 may be manufactured using back end of line (BEOL), middle of line (MOL), and/or back-side (Bside) processes.

Examples of materials for the substrate 20 include silicon dioxide; silicon nitride; glass; fluorosilicate glass (FSG); a silicon wafer whose surface is processed with wet thermal oxide (WTO) or similar treatment; carbon doped oxide (CDO); organic polymers such as perfluorocyclobutane (PFCB)-containing polymers or polytetrafluoroethylene (PTFE); organosilicates such as silsesquioxane, siloxane, organosilicate glass; flexible polymer; plastic; etc. Suitable combinations of such materials may also be used.

In this example, the substrate 20 is a {100} p-type boron-doped silicon wafer (0.01-0.02 Ω·cm) with about 500 nm of grown WTO, on which a thin layer (about 7-8 nm) of silicon dioxide is formed. An adhesion layer 22 of titanium nitride (about 0.5 nm) is formed over the silicon dioxide.

The source 12 is formed of a body of source material 30 disposed on the substrate 20.

Examples of source materials include various metals or other conductors, such as nickel, tungsten, ruthenium, molybdenum, copper, cobalt, titanium nitride, etc. Further examples of source materials include heavily doped n-type materials, degenerate n-type silicon, and III-V compound semiconductors with high conductivity with predominately n-type or electron transport, etc.

In this example, the body of source material 30 is ruthenium that is formed by sputtering to a thickness of about 25 nm.

The drain 14 is formed of a body of drain material 30 and has the same or similar material and/or structure as the source 12. In other examples, the drain 14 has a material and/or structure different to the source 12.

The adhesion layer 22 promotes the adhesion of the bodies of source and drain material 30, 32 to the substrate 20. Example materials for the adhesion layer include titanium nitride and hafnium nitride. In other examples, the adhesion layer 22 may be omitted if the source/drain material has suitable adhesion without it.

The TFT 10 further includes a body of channel material 50 disposed between the source 12 and drain 14. In this example, the body of channel material 50 is disposed partially over the bodies of source and drain material 30, 32 and over the substrate 20 between the bodies of source and drain material 30, 32. The channel material is a layer tin dioxide (i.e., $SnO_2$, referred to herein as tin oxide) that may have a thickness of about 5 nm to about 10 nm. In this example, the layer of tin oxide is about 7 nm thick.

The TFT 10 further includes a body of gate dielectric material 52 disposed over the body of channel material 50. Examples of gate dielectric materials include high-K dielectric materials, hafnium oxide, silicon dioxide, silicon nitride, zirconium oxide, and aluminum oxide. In this example, the body of gate dielectric material 52 is a layer of hafnium oxide about 12.5 nm thick.

The TFT 10 further includes a body of gate material 54 (also termed "gate metal") disposed over the gate dielectric material 52. The gate material is a conductor. Examples of gate materials include tungsten, titanium, titanium nitride, molybdenum, gold, platinum, aluminum, nickel, copper, chromium, hafnium, indium, manganese, iron, vanadium, zinc, tantalum, or alloys/combinations thereof. Suitable combinations of such materials may also be used. In this example, the body of gate material 54 is a layer of tungsten about 30 nm thick.

The TFT 10 further includes a source electrode 60 as part of the source 12 and a drain electrode 62 as part of the drain 14. The source electrode 60 is in electrical contact with the body of source material 30 to conduct current to/from the body of source material 30. Likewise, the drain electrode 62 is in electrical contact with the body of drain material 32 to conduct current to/from the body of drain material 32. Examples of materials for electrodes 60, 62 include the gate materials listed above.

In operation, when a voltage is applied across the source electrode 60 and a drain electrode 62, and when a suitable voltage is applied to the body of gate material 54, a carrier channel forms in the body of channel material 50, which causes the flow of current between the source 12 to the drain 14.

Figure 2:
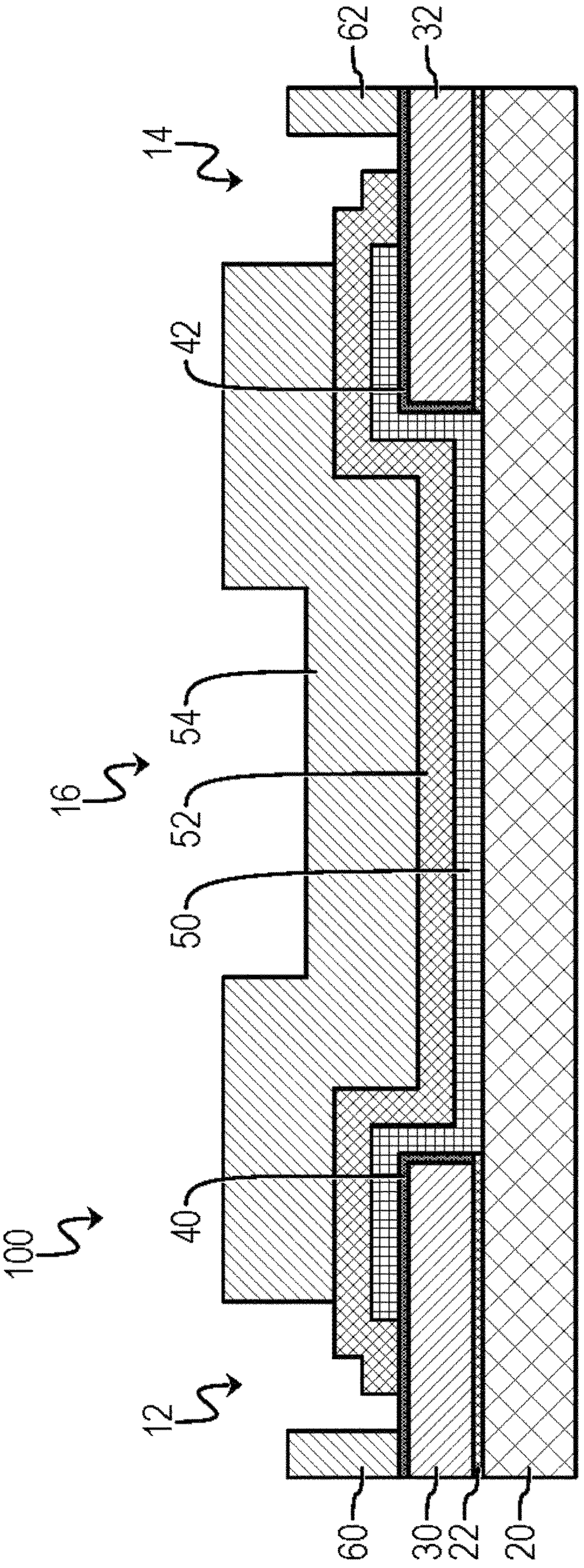
FIG. 2 is a cross-sectional view of an example thin-film transistor with a tin oxide semiconductor layer and treated source/drain according to the present disclosure.

FIG. 2 shows another example TFT 100 according to the present disclosure. The TFT 100 is substantially the same as the TFT 10 except that source and drain channel interfaces 40, 42 are provided. The above description may be referenced for details not repeated below.

The body of source material 30 may be subject to treatment (e.g., inline treatment), such as plasma treatment, anneal treatment, chemical or electro-chemical treatment, or similar. Different types of treatment may be combined. A treatment may be repeated two or more times.

The treatment may form a p-type source-channel interface 40 at the body of source material 30 and between the body of source material 30 and channel material 50. The source-channel interface 40 may tune the threshold voltage at which TFT 100 turns on and reduce leakage current through TFT 100 in the off state. The source-channel interface 40 may create a repository of complimentary excess charge that functions to deplete the channel in at least the region of the body of channel material 50 adjacent the body of source material 30. In this manner, the source-channel interface 40 serves as a voltage-controlled electron transport barrier, resulting in substantially less current flow through body of channel material 50 when TFT 100 is in an off state. In some cases, the source-channel interface 40 helps turn off the channel formed in the body of tin oxide channel material 50, thereby increasing the range of suitable operating conditions/parameters for the TFT 100. Further, the source-channel interface 40 may also serve to reduce stress induced leakage currents ("SILC") in TFT 100 by inhibiting the formation of interlayer stress-induced flaws between the body of channel material 50 and the body of source material 30. A drain-channel interface 42 may be similarly formed and may have similar characteristics, but it is contemplated that the source-channel interface provides 40 a significant benefit without the drain-channel interface 42 and may provide most or all of the benefit.

In this example, the bodies of source and drain material 30, 32 are treated with oxygen plasma to form a layer of oxidized material (e.g., ruthenium oxide) that are the source and drain channel interfaces 40, 42.

Further reference may be made to Barlage discussed above, which is incorporated herein by reference.

As mentioned above, in the TFTs 10, 100, the body of channel material 50 is a thin film of tin oxide. The tin oxide is generally polycrystalline or, more specifically, nanocrystalline tetragonal tin dioxide of space group P42/mnm with a preferred crystallite orientation of Miller index <110>, as determined using grazing-incidence x-ray diffraction (GI-XRD) with ω=0.5° on 40 nm thick samples formed on WTO. For sake of clarity, preferred crystallite orientation is with respect to powder, meaning that a crystallite orientation is preferred if present in a proportion higher than found in powder standard. The inventors have discovered that polycrystalline tin oxide with this preferred crystal orientation provides good carrier mobility, good carrier concentration, and good stability, which improves the performance and useful life of the TFT 10, 100. The proportion of the thin film of tin oxide of orientation of <110>is preferably at least about 45%, more preferably at least about 50%, and still more preferably at least about 55%.

For sake of clarity, tin oxide with an orientation of <110>means that one of the directions in the family of directions <110>, such as direction [110], is substantially normal to the plane of the substrate 20. In other words, a plane of the family {110}, such as the plane (110), is substantially parallel to the plane of the substrate 20.

The crystallinity of the thin film of tin oxide is preferably at least about 70%, more preferably at least about 75%, more preferably at least about 80%, more preferably at least about 85%, more preferably at least about 90%, and still more preferably at least about 95%. Regions outside the 2θangular range of 20-60° may be ignored when computing crystallinity.

Figure 3A:
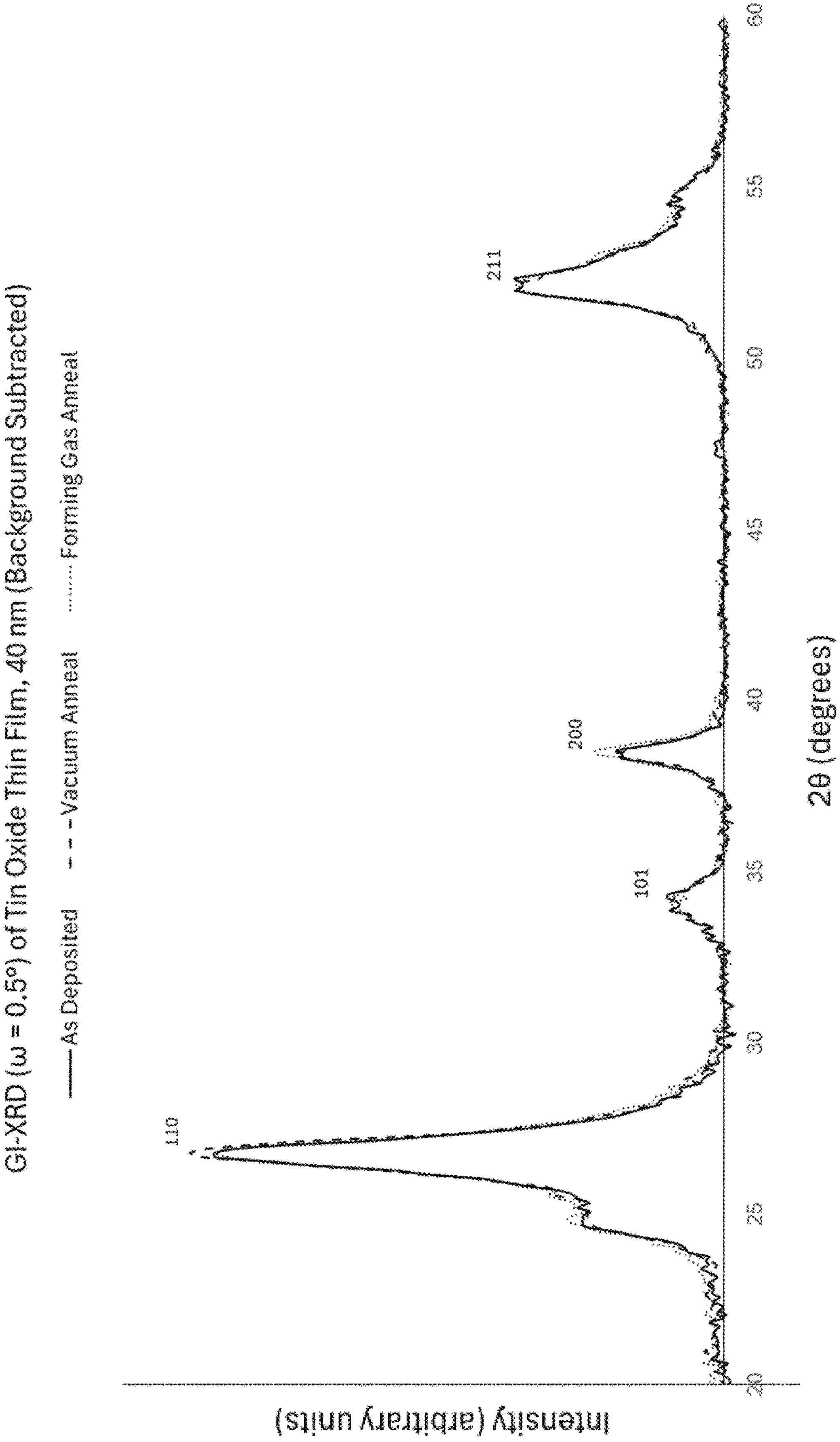
FIG. 3A is a plot of example preferred crystal orientations for a 40 nm tin oxide thin film according to the present disclosure.

FIG. 3A shows GI-XRD (ω=0.5°) plots of 40 nm thick samples of tin oxide thin film formed on WTO using Recipe "A" described below. Three samples are plotted, namely, tin oxide as deposited, as annealed under vacuum at 400° C. for 60 minutes, and after undergoing forming gas anneal at 400° C. for 120 minutes. As can be seen, the plots generally follow the XRD pattern of cassiterite. The ratios of peak intensities of different crystal orientations with <110>as a basis value of 1 are listed below in Table 1.

TABLE 1

Peak Intensity Ratios for Tin Oxide Crystal Orientations with <110> as Basis

| Orientation | 110 | 101 | 200 | 211 |
|---|---|---|---|---|
| As Deposited | 1 | 0.11 | 0.21 | 0.41 |
| Vacuum Anneal | 1 | 0.10 | 0.21 | 0.39 |
| Forming Gas Anneal | 1 | 0.10 | 0.25 | 0.41 |

The consistency of the peak values across the three different annealing conditions demonstrates the stability of the film.

Figure 3B:
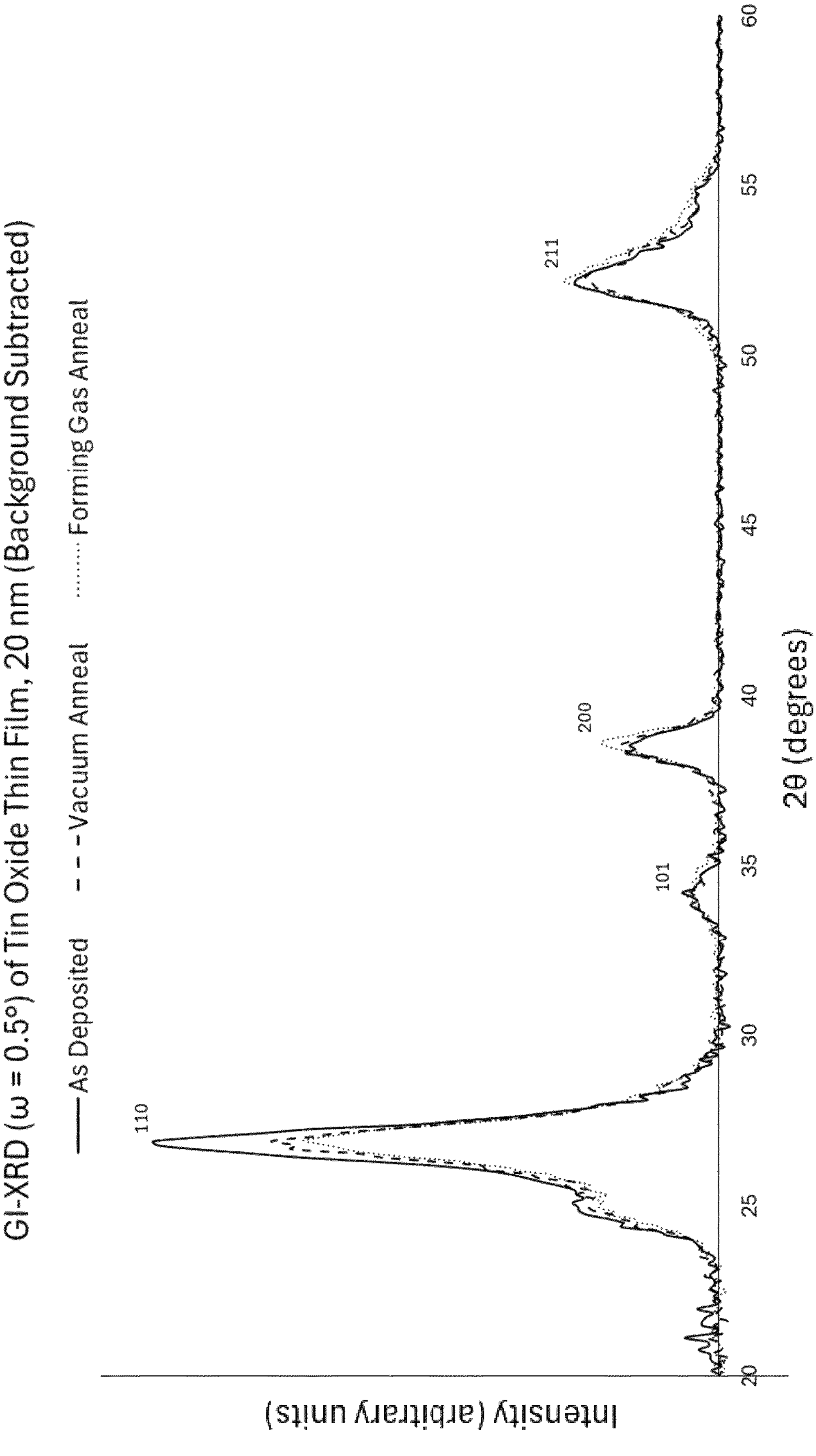
FIG. 3B is a plot of example preferred crystal orientations for a 20 nm tin oxide thin film according to the present disclosure.

FIG. 3B shows GI-XRD (Ω=0.5°) plots of 20 nm thick samples of tin oxide thin film formed on WTO using Recipe "A" described below. Three samples are plotted, namely, tin oxide as deposited, as annealed under vacuum at 400° C. for 60 minutes, and after undergoing forming gas anneal at 400° C. for 120 minutes. As can be seen, the plots are consistent with the 40 nm samples of FIG. 3A.

Peak intensity ratios may be used to describe the tin oxide thin films discussed herein. For example, with reference to Table 1, the ratio of crystal-orientation peak intensities of Miller index <101>:<110>is 0.11:1, as deposited. A ratio that is less would be 0.10:1, 0.09:1, etc. Expressions of such ratios that describe the tin oxide thin films discussed herein are provided elsewhere herein.

It is important to note that GI-XRD measurements were performed on 20 nm and 40 nm thick films of tin oxide to provide sufficient accuracy, as the GI-XRD technique loses accuracy as film thickness decreases. While 20 nm and 40 nm are considerably thicker than the body of channel material 50 (about 5-10 nm, e.g., 7 nm) discussed above, GI-XRD may still be used to establish useful process parameters. Process parameters may be established by having a thicker film, such as 20 nm or 40 nm, take the preferred crystal orientation. A thinner film, such as 7 nm, may then be deposited using these established process parameters. If the thinner film performs sufficiently well, then the process parameters are useful. While it is contemplated that the thinner film will have the same or similar crystal orientation as the thicker film, this need not be confirmed with measurement.

Resistivity of the thin film of tin oxide has been found to be in the range of about 0.001-1 Ω·cm, as deposited. Annealing at 400° C. for at least 30 minutes in air, nitrogen, or forming gas reduced resistivity to the range of about 0.001-0.1 Ω·cm. Annealing at 400° C. for at least 30 minutes in nitrogen or forming gas reduced resistivity to the range of about 0.001-0.01 Ω·cm. Resistivity of the thin film of tin oxide is preferably less than about 0.0050 Ω·cm, more preferably less than about 0.0040 Ω·cm, and still more preferably less than or equal to about 0.0036 Ω·cm.

The crystallinity and preferred orientation of the tin oxide thin film help achieve high carrier mobility. High crystallinity leads to fewer defects and grain boundaries, reducing obstacles for carrier movement and thus improving mobility. Aligning the crystalline grains in the preferred orientation discussed herein further enhances carrier transport. With the techniques described herein, mobility of the thin film of tin oxide has been generally found to be in the range of about 60-120 $cm^2/V \cdot s$. Mobility is preferably at least about 70 $cm^2/V \cdot s$, more preferably at least about 100 $cm^2/V \cdot s$, more preferably at least about 110 $cm^2/V \cdot s$, and still more preferably at least above 120 $cm^2/V \cdot s$.

Other chemical species may be included in the tin oxide (e.g., by doping) to improve stability, carrier concentration, conductance, or other property. For example, fluorine, chlorine, nitrogen, or similar material may be introduced to the tin oxide. In the example of chlorine, chlorine atoms may replace oxygen atoms in the tin oxide. Chlorine may be present in concentrations (relative to oxygen) of about 10% or less, preferably about 5% or less, more preferably about 2% or less, more preferably about 1% or less, and still more preferably about 0.7%. Alternatively, fluorine or nitrogen may be introduced at the same proportions.

In various examples, any one or suitable combination of nitrogen, chlorine, and/or fluorine may be used. In one such example, nitrogen and chlorine are used in approximately equal amounts.

In various examples, the thin film of tin oxide has minimal deleterious elements or species between grain boundaries that would inhibit the transport of carriers to less than about 50% of the maximum conductance.

In various examples, the thin film of tin oxide has a carrier concentration of less than or equal to about $2.5\times10^{19}$ $cm^{-3}$, less than or equal to about $1.5\times10^{19}$ $cm^{-3}$, less than or equal to about $1.0\times10^{19}$ $cm^{-3}$, or less than or equal to about $0.5\times10^{19}$ $cm^{-3}$, as extracted from a capacitance-voltage testing method that uses a vertical, parallel-plate capacitor test structure.

In various examples, the thin film of tin oxide withstands forming gas or other hydrogen condition up to about 550° C. with its carrier concentration not increasing more than two-fold.

TFT 10, 100 may be manufactured using FEOL processes, MOL processes, BEOL processes, Bside processes, or a combination of such. A manufacturing process may include forming one or more layers of TFTs 10, 110 over other devices made using FEOL, MOL, BEOL, and/or Bside processes.

The manufacture of materials, layers, and/or features of semiconductor devices is referred to herein as "forming." As will be apparent to those of ordinary skill in the art, unless otherwise mentioned, "forming" is intended to include all semiconductor manufacturing techniques suitable and applicable therefor including, without limitation, deposition (e.g., chemical vapor deposition or CVD, atomic layer deposition or ALD, physical vapor deposition or PVD, etc.), plasma-enhanced/assisted atomic layer deposition (PEALD/PAALD), thermal ALD (T-ALD), plasma-enhanced chemical vapor deposition (PECVD), sputtering, lithography/photolithography, etching, implantation, annealing, oxidation, and similar processes. While examples of specific types of forming are given below, it should be understood that comparable methods of forming may be alternatively or additionally used, unless otherwise mentioned, without departing from the present disclosure.

When annealing is used during "forming", it is preferably done at a temperature in the range of from about 300° C. to about 500° C., more preferably from about 350° C. to about 450° C., more preferably from about 375° C. to about 425° C., most preferably at about 400° C.

With reference to FIGS. 1 and 2, a substrate 20 may be formed as discussed above. An adhesion layer 22 of, for example, titanium nitride may be formed over the substrate by PEALD, for example.

A layer of source/drain material, such as ruthenium, is formed over the adhesion layer 22. The source/drain material may be formed by sputtering to a desired thickness, such as about 25 nm.

The layer of source/drain material is then patterned to form separate bodies of source and drain material 30, 32 and define a gap therebetween. Lithography and etching, such as inductively coupled plasma reactive ion etching (ICP-RIE), may be used to form the bodies of source and drain material 30, 32. The adhesion layer 22, if used and if conductive, should also be etched to avoid shorting the source 12 and drain 14.

Next, in the case of TFT 100, source and drain channel interfaces 40, 42 are formed. This may include treating the bodies of source and drain material 30, 32 with oxygen plasma to form a layer of oxidized material thereon. In other examples, source and drain channel interfaces 40, 42 may be deposited by ALD or other deposition process.

Subsequently, a layer of channel material is formed over the bodies of source and drain material 30, 32 and over the substrate 20 within the gap between the bodies of source and drain material 30, 32.

In this example (Recipe "A"), the layer of channel material, i.e., tin oxide, is formed by PEALD using tetraallyltin ($C_{12}H_{20}Sn$) as precursor with oxygen plasma. Plasma power is nominally 600 W and chamber pressure is about 1 Torr. The substrate temperature is about 190° C. and the ampoule temperature is about 82° C. Oxygen flow rate is about 60 standard cubic centimeters per minute (sccm) and argon carrier gas flow rate is about 100 sccm. A cycle is performed as follows: 0.06 seconds of precursor dose, 3 seconds of purge, 5 seconds of oxygen plasma, and 7 seconds of purge.

In another example (Recipe "B"), the layer of channel material, i.e., tin oxide, is formed by PEALD using tetraallyltin ($C_{12}H_{20}Sn$) as precursor with oxygen plasma. Plasma power is nominally 600 W and chamber pressure is about 0.87 Torr. The substrate temperature is about 190° C. and the ampoule temperature is about 83.5° C. Oxygen flow rate is about 60 sccm and argon carrier gas flow rate is about 160 sccm. A cycle is performed as follows: 0.25 seconds of precursor dose, 9 seconds of purge, 16 seconds of oxygen plasma, and 5 seconds of purge.

In both examples above, ALD cycles are repeated until the desired thickness of film is obtained. In this manner, the tin oxide may be deposited to any suitable desired thickness, such as about 7 nm. In various examples, chlorine, fluorine, nitrogen, or other stabilizing species may be introduced during the PEALD process.

In both examples above, excess oxygen is provided such that the film of tin oxide is formed in an oxygen rich environment.

In various examples, including modifications of the above examples, the substrate temperature is between about 150° C. and about 220° C., or more particularly between about 170° C. and 210° C., and the ampoule temperature is between about 72° C. and about 92° C.

While the inventors have found that substrate temperatures above 220° C. can provide the desired tin oxide film characteristics mentioned herein, such as improved carrier concentration and mobility, the inventors have also unexpectedly discovered that such elevated temperatures may undesirably degrade the source and drain channel interfaces 40, 42 in certain circumstances. Hence, the recited substrate temperature ranges are particularly useful for implementations that use the channel interfaces 40, 42.

Gate dielectric material is then formed over the tin oxide channel material. This may be done in two separate deposition and patterning operations. After an initial deposition of gate dielectric material, the gate dielectric material and underlying channel material may be patterned together using the same mask. Then, to prevent the channel material from shorting to the body of gate material 54, a second layer of gate dielectric material may be deposited and patterned in a manner that encapsulates the channel material, as shown at 66 in FIG. 1. Alternatively, a single deposition and patterning operation may be used to form the gate dielectric material.

The initial layer of gate dielectric material is formed over the layer of channel material. A layer of hafnium oxide may be formed by PEALD using tetrakis(dimethylamino)hafnium (TDMAH) as precursor with oxygen plasma at about 277° C. The initial layer of hafnium oxide may be deposited to a desired thickness, such as about 5 nm. In other examples, other materials and processes may be used for the gate dielectric material.

The layers of tin oxide and hafnium oxide are then patterned. Lithography and etching, such as ICP-RIE, may be used. The same mask may be used to give the same pattern to both layers. This patterning completes the body of channel material 50.

The second layer of gate dielectric material is then formed over the patterned initial layer of gate dielectric material. PEALD may be used, as discussed above. The second layer of hafnium oxide may be deposited to a desired thickness, such as about 7.5 nm.

The second layer of gate dielectric material is then patterned. Lithography and etching, such as ICP-RIE, may be used. The pattern used to form the second layer of gate dielectric material should be larger than the pattern used to form the initial layer of gate dielectric material and channel material, so that edges of the body of channel material 50 are covered by gate dielectric material, as shown at 66 in FIG. 1. This patterning completes the body of gate dielectric material 52.

Then, a layer of gate material is formed. In this example, the layer of gate material ultimately forms the body of gate material 54 and the source and drain electrodes 60, 62. The layer of gate material may be formed by sputtering material mentioned above.

The layer of gate material may then be patterned to form the separate body of gate material 54 and source and drain electrodes 60, 62. Lithography and etching, such as ICP-RIE, may be used.

The TFT 10, 100 may then be annealed at conditions mentioned above. It is contemplated that annealing causes excess oxygen in the tin oxide channel material to settle in vacancies and thereby reduce carrier concentration to the desired level.

Preferred embodiments of the disclosure will be illustrated with reference to the following Examples which are non-limiting and should not be used to construe or limit the scope of the disclosure.

EXAMPLE 1

Figure 4:
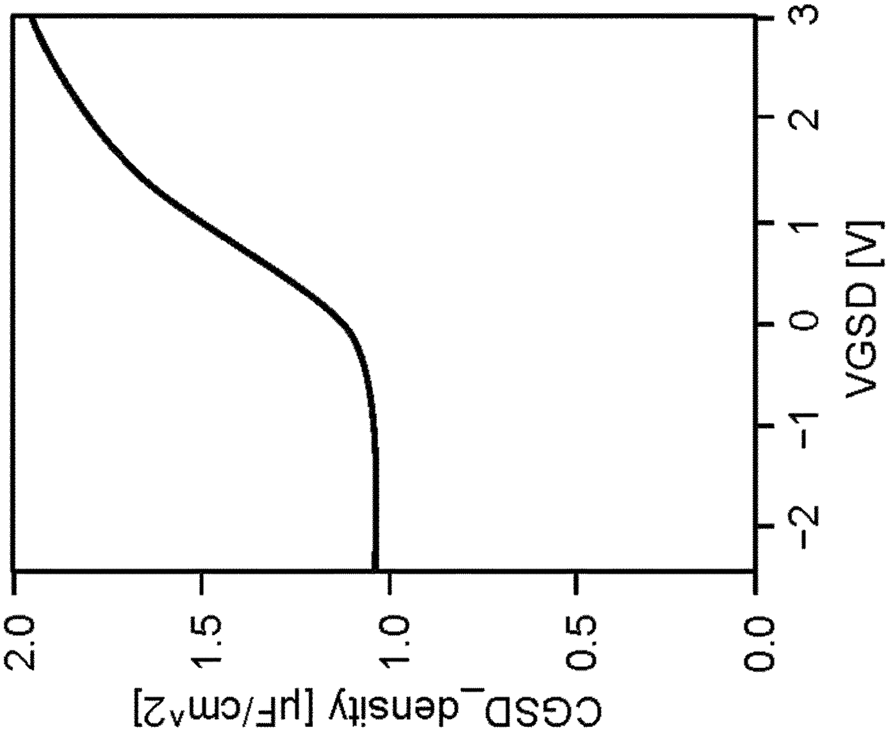
FIG. 4 is a plot of a capacitance-voltage (C-V) test for an example tin oxide semiconductor layer according to the present disclosure.

A wafer was prepared, as discussed above with regard to the substrate 20, and a thin film of tin oxide was deposited, using Recipe "A" discussed above, to a thickness of 7 nm. A forming gas anneal at 400° C. for 120 minutes was performed. The resulting tin oxide film was determined to have a crystallinity (2θ of 20-60°) of 95.6% with a preferred orientation (GI-XRD with ω=0.5°) of Miller index <110>. Resistivity was measured to be 0.00391 Ω·cm. Carrier mobility was measured to be 115.6 $cm^2/V \cdot s$. Metal-oxide semiconductor (MOS) capacitor or MOSCAP capacitance-voltage (C-V) profiling was performed with the results shown in FIG. 4.

With another film, deposited in the same manner to a thickness of 10 nm, atomic force microscopy (AFM) roughness (root mean square or Rq) was measured to be 0.55 nm.

EXAMPLE 2

A VCV stack was formed and tested as follows.

A silicon substrate was pretreated as follows: argon (95%)/hydrogen (5%) plasma for 10 seconds, oxygen plasma for 60 seconds, and then nitrogen plasma for 30 seconds.

A film of tin oxide was formed on the silicon substrate according to Recipe "A" described above. The film was formed to a nominal thickness of 7 nm. The actual thickness of the film was measured to be 7.5 nm.

Prior to forming a film of hafnium oxide over the tin oxide film, the tin oxide film was first pretreated with oxygen plasma for 30 seconds. PEALD was used to form the hafnium oxide film using tetrakis(dimethylamino)hafnium (IV) (TDMAHf) as the precursor and oxygen as the reactant. The PEALD was conducted at 190° C. with a plasma power of 600 W. The film was formed to a thickness of 7 nm.

Metal layers were then formed over the hafnium oxide film. First a film of titanium nitride was formed to a thickness of 5 nm using reactive sputtering. Then a 30-nm film of tungsten was formed over the titanium nitride using sputtering.

A four-point probe (4pp) test was conducted on a thin film of tin oxide that was formed in the same manner as above, and a sheet resistance, $R_{sh}$, of 24643 ohms/square was measured.

Figure 5:
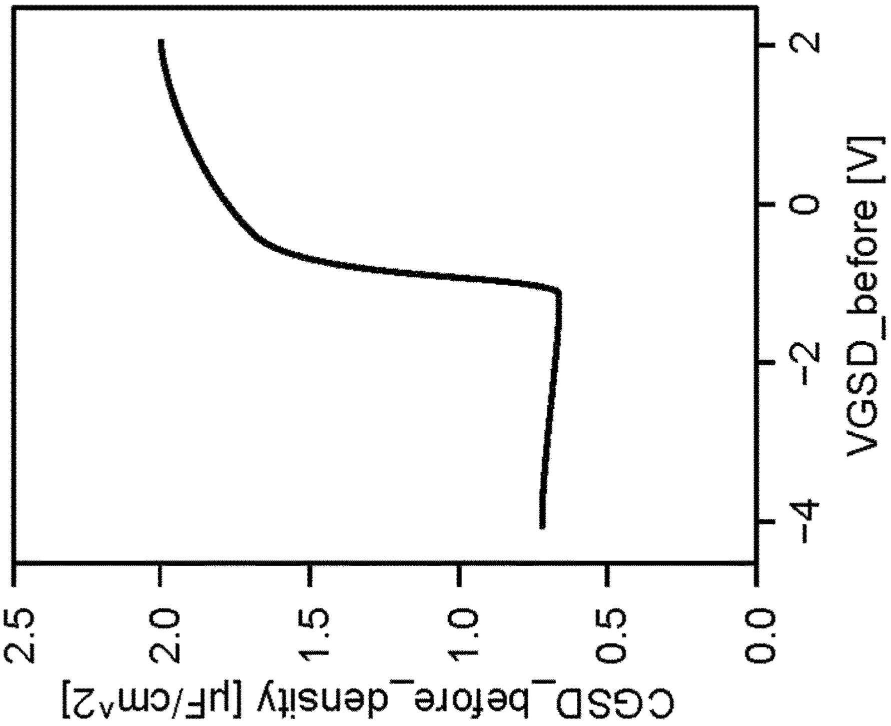
FIG. 5 is a plot of a C-V test for another example tin oxide semiconductor layer according to the present disclosure.

Carrier concentration, $N_d$, of the stack was determined by a CV test. Carrier concentration was computed based on an after-burn-in (ABI) capacitance gate-to-source/drain (CGSD) measurement. FIG. 5 shows the CGSD plot. A carrier concentration of $0.1505 \times 10^{19}$ $cm^{-3}$ was determined from the slope of this plot and the following relationship:

$$N_d = \frac{-2}{q\varepsilon_s A^2 \left( \frac{d\left(\frac{1}{C^2}\right)}{dV} \right)}$$

where q is the elementary charge and &s is the substrate permittivity of 14 (relative permittivity)$\times 8.8542 \times 10^{-14}$ F/cm.

Mobility of the tin oxide film, u, was determined to be 153.2 $cm^2/V \cdot s$ from the following relationship:

$$\mu = \frac{1}{R_{sh} \cdot t \cdot N_d \cdot q}$$

where $R_{sh}$ is the measured sheet resistance 24643 ohms/square, t is the as-formed thickness of 7.5 nm, Nd is the carrier concentration as above, and q is the elementary charge.

This tin oxide film is compared to known films in Table 2 below, namely, *The conducting tin oxide thin films deposited via atomic layer deposition using Tetrakis-dimethylamino tin and peroxide for transparent flexible electronics* by Choi et al. ("Choi 2014"); *Effect of Oxygen Source on the Various Properties of $SnO_2$Thin Films Deposited by Plasma-Enhanced Atomic Layer Deposition* by Won et al. ("Won 2020"); *Morphology, composition and electrical properties of SnO2:Cl thin films grown by atomic layer deposition* by Cheng et al. ("Cheng 2015"). Note that Table 2 is a summary only and these papers should be consulted for further details of the indicated films, other films reported, post-publication corrections, etc.

TABLE 2

Comparison with Known Techniques

| Publication | Carrier Concentration ($\times10^{19}$ $cm^{-3}$) | Mobility ($cm^2/V \cdot s$) | Resistivity ($\times10^{-3}$ ohm · cm) |
|---|---|---|---|
| Choi 2014 | 9 | 76 | 0.97 |
| Won 2020 | 0.01 | 1.5 | 38,000 |
| Won 2020 | 2.5 | 23 | 10 |
| Cheng 2015 | 1.7 | 14 | 26 |
| Example 2 | 0.2365 | 153.2 | 17.25 |

As can be seen, the tin oxide film of the present disclosure (illustrated in Example 2) has relatively high carrier mobility and relatively low carrier concentration. Known films do not have the same high degree of mobility. Further, the known film with the highest mobility (Choi 2014) has only about half the mobility of the present film and an undesirably high carrier concentration. Conversely, known films that have a relatively low carrier concentration also have undesirably low mobility.

EXAMPLE 3

A TFT was formed substantially as shown and described with respect to FIG. 2. Source and drain were formed of ruthenium and the channel interfaces were formed by oxidation of the source and drain. Tin oxide channel material was formed using Recipe "A" described above. The gate dielectric was hafnium oxide. The gate material was titanium and gold. The TFT was annealed in forming gas at about 300° C. for about 30 minutes.

Figure 6:
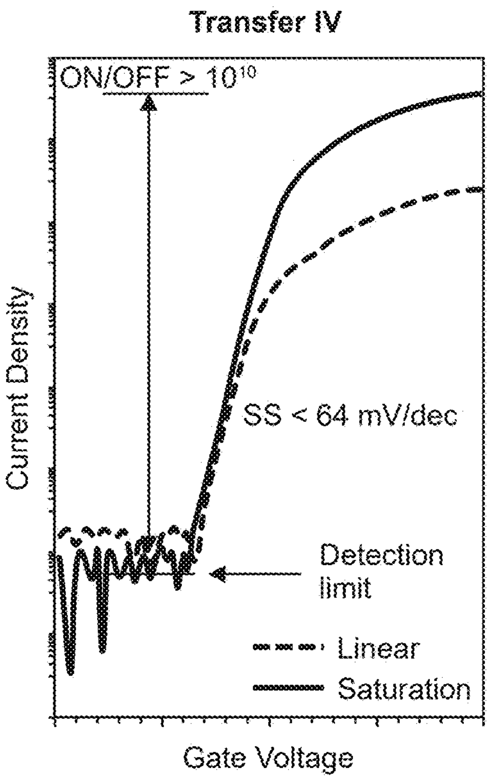
FIG. 6 is a plot of transfer IV for a TFT made in accordance with this disclosure.
Figure 7:
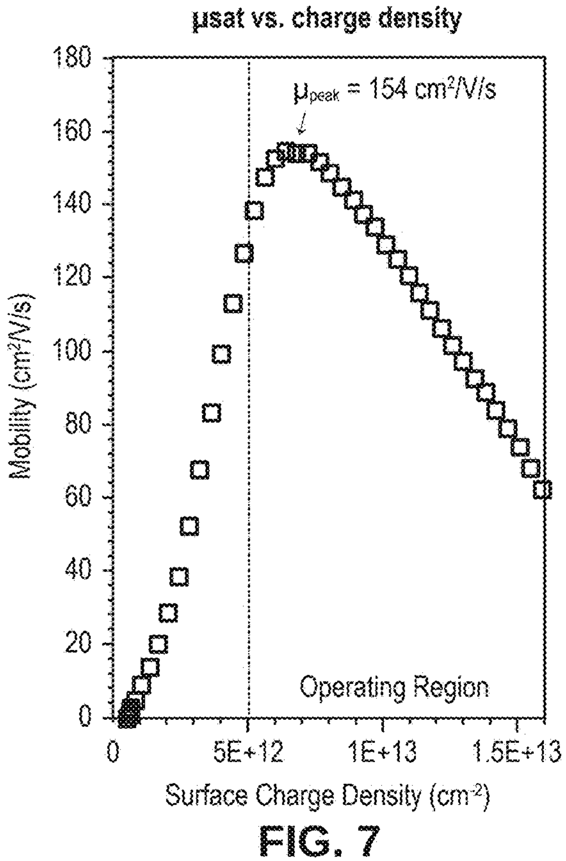
FIG. 7 is a plot mobility for the same TFT referred to for FIG. 6.

FIG. 6 shows a transfer IV plot for the TFT. A subthreshold swing (SS) of less than about 64 m V/decade and an on-off ratio of greater than $1\times10^{10}$ were obtained. FIG. 7 shows mobility for the TFT which peaks at about 154 $cm^2/V \cdot s$. Current throughput was about 200 μA/μm.

EXAMPLE 4

Figure 8:
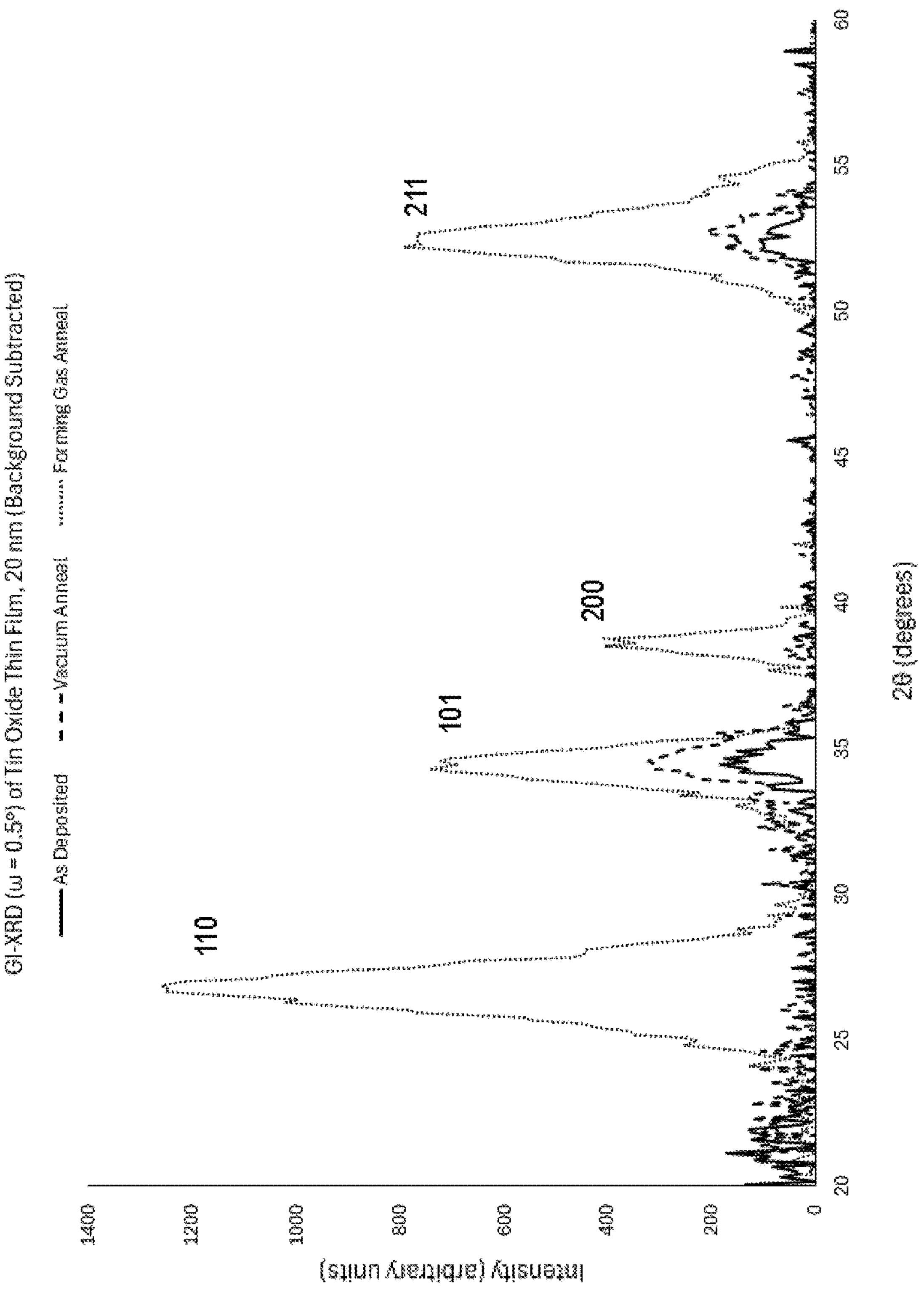
FIG. 8 is a plot of another example of preferred crystal orientations for a 20 nm tin oxide thin film according to the present disclosure.

FIG. 8 shows GI-XRD (ω=0.5°) plots of 20 nm thick samples of tin oxide thin film formed on WTO according to Recipe "A" discussed above, except with a substrate temperature of about 50° C. Three samples are plotted, namely, tin oxide as deposited, as annealed under vacuum at 400° C. for 60 minutes, and after undergoing forming gas anneal at 400° C. for 120 minutes.

As can be seen, the as-deposited and vacuum annealed films were largely amorphous. The film annealed with forming gas was nanocrystalline and was determined to have a mobility exceeding 100 $cm^2/V \cdot s$.

EMBODIMENT #1

Various embodiments of Preferred Embodiment #1 of the present disclosure are described in the following numbered clauses:

Clause 1. A thin-film transistor comprises a substrate, a source disposed on the substrate, a drain disposed on the substrate, a gate, and a thin film of tin oxide disposed within the influence of the gate between the source and the drain. The thin film of tin oxide forms a carrier channel between the source and the drain when sufficient voltage is applied to the gate. The thin film of tin oxide has a preferred crystallite orientation of Miller index <110>.

Clause 2. The thin-film transistor defined in Clause 1, wherein the preferred crystallite orientation of Miller index <110>is determined by grazing-incidence x-ray diffraction on a 40 nm thick sample of tin oxide formed using the same process parameters used to form the thin film of tin oxide.

Clause 3. The thin-film transistor defined in Clause 1 or 2, wherein the substrate is a planar substrate, and the thin film of tin oxide has the preferred crystallite orientation of Miller index <110>substantially normal to the planar substrate.

Clause 4. The thin-film transistor defined in Clause 1 or 2, wherein at least about 45% of the thin film of tin oxide has the crystallite orientation of Miller index <110>.

Clause 5. The thin-film transistor defined in Clause 4, wherein at least about 50% of the thin film of tin oxide has the crystallite orientation of Miller index <110>.

Clause 6. The thin-film transistor defined in Clause 4, wherein at least about 55% of the thin film of tin oxide has the crystallite orientation of Miller index <110>.

Clause 7. The thin-film transistor defined in Clause 1 or 2, wherein the thin film of tin oxide has a crystal-orientation peak intensity of Miller index <200>that is less than a crystal-orientation peak intensity of Miller index <211>.

Clause 8. The thin-film transistor defined in Clause 7, wherein the thin film of tin oxide has a ratio of crystal-orientation peak intensities of Miller index <101>:<110>of about 0.6:1 or less.

Clause 9. The thin-film transistor defined in Clause 8, wherein the thin film of tin oxide has a ratio of crystal-orientation peak intensities of Miller index <101>:<110>of about 0.2:1 or less.

Clause 10. The thin-film transistor defined in Clause 7, 8, or 9, wherein the thin film of tin oxide has a ratio of crystal-orientation peak intensities of Miller index <211>:<110>of about 0.5:1 or less.

Clause 11. The thin-film transistor defined in Clause 1 or 2, wherein the thin film of tin oxide has a ratio of crystal-orientation peak intensities of Miller index <200>:<110>of about 0.5:1 or less.

Clause 12. The thin-film transistor defined in Clause 11, wherein the thin film of tin oxide has a ratio of crystal-orientation peak intensities of Miller index <200>:<110>of about 0.4:1 or less.

Clause 13. The thin-film transistor defined in Clause 12, wherein the thin film of tin oxide has a ratio of crystal-orientation peak intensities of Miller index <200>:<110>of about 0.3:1 or less.

Clause 14. The thin-film transistor defined in Clause 11, 12 or 13, wherein the thin film of tin oxide has a ratio of crystal-orientation peak intensities of Miller index <101>:<110>of about 0.6:1 or less.

Clause 15. The thin-film transistor defined in Clause 1 or 2, wherein the thin film of tin oxide has a ratio of crystal-orientation peak intensities of Miller index <211>:<110>of about 0.45:1 or less.

Clause 16. The thin-film transistor defined in Clause 15, wherein the thin film of tin oxide has a ratio of crystal-orientation peak intensities of Miller index <200>:<110>of about 0.5:1 or less.

Clause 17. The thin-film transistor defined in Clause 16, wherein the thin film of tin oxide has a ratio of crystal-orientation peak intensities of Miller index <101>:<110>of about 0.2:1 or less.

Clause 18. The thin-film transistor defined in Clause 15, wherein the thin film of tin oxide has a ratio of crystal-orientation peak intensities of Miller index <101>:<110>of about 0.3:1 or less, a ratio of crystal-orientation peak intensities of Miller index <200>:<110>of about 0.5:1 or less, and a ratio of crystal-orientation peak intensities of Miller index <211>:<110>of about 0.6:1 or less.

Clause 19. The thin-film transistor defined in Clause 18, wherein the thin film of tin oxide has a ratio of crystal-orientation peak intensities of Miller index <101>:<110>of about 0.2:1 or less, a ratio of crystal-orientation peak intensities of Miller index <200>:<110>of about 0.3:1 or less, and a ratio of crystal-orientation peak intensities of Miller index <211>:<110>of about 0.5:1 or less.

Clause 20. The thin-film transistor defined in Clause 18, wherein the thin film of tin oxide has a crystal-orientation peak intensity of Miller index <200>that is less than a crystal-orientation peak intensity of Miller index <211>.

Clause 21. The thin-film transistor defined in Clause 18, wherein the thin film of tin oxide has a ratio of crystal-orientation peak intensities of Miller index <101>:<110>of about 0.4:1 or less, and a ratio of crystal-orientation peak intensities of Miller index <200>:<110>of about 0.4:1 or less.

Clause 22. The thin-film transistor defined in Clause 21, wherein the thin film of tin oxide has a ratio of crystal-orientation peak intensities of Miller index <101>:<110>of about 0.3:1 or less, and a ratio of crystal-orientation peak intensities of Miller index <200>:<110>of about 0.3:1 or less.

Clause 23. The thin-film transistor defined in Clause 22, wherein the thin film of tin oxide has a ratio of crystal-orientation peak intensities of Miller index <101>:<110>of about 0.2:1 or less.

Clause 24. A transistor comprising a thin film of tin oxide to form a carrier channel between a source and a drain when sufficient voltage is applied to a gate, wherein the thin film of tin oxide has a preferred crystallite orientation of Miller index <110>.

Clause 25. A method of forming a transistor comprises forming a thin film of tin oxide as a channel material between a source and drain using plasma-enhanced atomic layer deposition (PEALD) using tetraallyltin as precursor with oxygen plasma.

Clause 26. The method defined in Clause 25, further comprising maintaining a substrate temperature within a range of about 150° C. to about 220° C.

Clause 27. The method defined in Clause 26, further comprising maintaining the substrate temperature at about 190° C.

Clause 28. The method defined in Clause 25, further comprising maintaining an ampoule temperature within a range of about 72 to 92° C.

Clause 29. The method defined in Clause 28, further comprising maintaining the ampoule temperature at about 82° C.

Clause 30. The method defined in Clause 25, wherein a PEALD cycle is repeated to perform the forming, wherein each cycle includes, in sequence: introducing the precursor, purging, applying the oxygen plasma, and purging.

Clause 31. The method defined in Clause 25, further comprising introducing chlorine, fluorine, and/or nitrogen during the PEALD to stabilize the tin oxide.

Clause 32. The method defined in Clause 25, wherein the thin film of tin oxide has a preferred crystallite orientation of Miller index <110>.

EMBODIMENT #2

Various embodiments of Preferred Embodiment #2 of the present disclosure are described in the following numbered clauses:

Clause 1. A thin-film transistor comprising: a substrate; a source disposed at the substrate; a drain disposed at the substrate; a gate; and a thin film of tin oxide disposed within the influence of the gate between the source and the drain, the thin film of tin oxide to form a carrier channel between the source and the drain when sufficient voltage is applied at the gate; wherein the thin film of tin oxide has carrier concentration of less than or equal to $1.0\times10^{19}$ $cm^{-3}$ and a mobility of greater than or equal to 100 $cm^2/V\cdot s$.

Clause 2. The thin-film transistor defined in Clause 1, wherein the thin film of tin oxide has a crystallinity of greater than or equal to 80%.

Clause 3. The thin-film transistor defined in any one of Clauses 1-2, wherein the thin film of tin oxide is nanocrystalline.

Clause 4. The thin-film transistor defined in any one of Clauses 1-3, wherein the thin film of tin oxide has a preferred crystallite orientation of Miller index <110>.

Clause 5. The thin-film transistor defined in Clause 4, wherein the thin film of tin oxide has a ratio of crystal-orientation peak intensities of Miller index <101>:<110>of 0.2:1 or less, a ratio of crystal-orientation peak intensities of Miller index <200>:<110>of 0.3:1 or less, and a ratio of crystal-orientation peak intensities of Miller index <211>:<110>of 0.5:1 or less.

Clause 6. The thin-film transistor defined in Clause 4 or Clause 5, wherein the preferred crystallite orientation of Miller index <110>is determined by grazing-incidence x-ray diffraction on a 20-nm or 40-nm thick sample of tin-oxide film formed using the same process used to form the thin film of tin oxide.

Clause 7. The thin-film transistor defined in any one of Clauses 1-6, wherein the mobility is determined with a four-point probe.

Clause 8. A method of forming a thin-film transistor comprising: forming a thin film of tin oxide as a channel material between a source and a drain using atomic layer deposition (ALD); wherein the thin film of tin oxide has carrier concentration of less than or equal to $1.0\times10^{19}$ $cm^{-3}$ and a mobility of greater than or equal to 100 $cm^2/V\cdot s$.

Clause 9. The method defined in Clause 8, comprising forming the thin film of tin oxide using plasma-enhanced ALD (PEALD).

Clause 10. The method defined in Clause 9, wherein the PEALD incudes tetraallyltin as precursor and oxygen plasma as reactant.

Clause 11. The method defined in any one of Clauses 8-10, further comprising introducing chlorine to the thin film of tin oxide.

Clause 12. The method defined in any one of Clauses 8-10, further comprising introducing fluorine to the thin film of tin oxide.

Clause 13. The method defined in any one of Clauses 8-12, further comprising introducing nitrogen to the thin film of tin oxide.

Clause 14. The method defined in any one of Clauses 8-13, further comprising annealing the thin film of tin oxide.

Clause 15. The method defined in any one of Clauses 8-14, wherein the annealing is performed at 400° C.

Clause 16. A thin film of tin oxide having a carrier concentration of less than or equal to $1.0\times10^{19}$ $cm^{-3}$ and a mobility of greater than or equal to 100 $cm^2/V\cdot s$.

Clause 17. The thin film defined in Clause 16, wherein the thin film of tin oxide has a crystallinity of greater than or equal to 80%.

Clause 18. The thin film defined in Clause 16 or Clause 17, wherein the thin film of tin oxide has a preferred crystallite orientation of Miller index <110>.

Clause 19. A method of forming a thin film comprising: forming a thin film of tin oxide using atomic layer deposition (ALD); wherein the thin film of tin oxide has carrier concentration of less than or equal to $1.0\times10^{19}$ cm$^{-3}$ and a mobility of greater than or equal to 100 cm$^2$/V·s.

Clause 20. The method defined in Clause 19, further comprising annealing the thin film of tin oxide.

EMBODIMENT #3

Various embodiments of Preferred Embodiment #3 of the present disclosure are described in the following numbered clauses:

Clause 1. A thin-film transistor comprising: a substrate; a source disposed at the substrate; a drain disposed at the substrate; a gate; and a thin film of tin oxide disposed within the influence of the gate between the source and the drain, the thin film of tin oxide to form a carrier channel between the source and the drain when sufficient voltage is applied at the gate; wherein the thin film of tin oxide as an XRD pattern having (a) a main characteristic peak at 26.59° (2θ) and (b) a shoulder peak at 25° (2θ), wherein the intensity of (b) is less than or equal to about 35% of the intensity of (a).

Clause 2. The thin-film transistor defined in Clause 1, wherein the intensity of (b) is in the range of from about 25% to about 35% of the intensity of (a).

Clause 3. The thin-film transistor defined in Clause 1 or Clause 2, wherein the thin film of tin oxide has carrier concentration of less than or equal to $1.0\times10^{19}$ cm$^{-3}$ and a mobility of greater than or equal to 100 cm$^2$/V·s.

Clause 4. The thin-film transistor defined in any one of Clauses 1-3 wherein the thin film of tin oxide has a crystallinity of greater than or equal to 80%.

Clause 5. The thin-film transistor defined in any one of Clauses 1-4, wherein the thin film of tin oxide is nanocrystalline.

Clause 6. The thin-film transistor defined in any one of Clauses 1-5, wherein the thin film of tin oxide has a preferred crystallite orientation of Miller index <110>.

Clause 7. The thin-film transistor defined in Clause 6, wherein the thin film of tin oxide has a ratio of crystal-orientation peak intensities of Miller index <101>:<110>of 0.2:1 or less, a ratio of crystal-orientation peak intensities of Miller index <200>:<110>of 0.3:1 or less, and a ratio of crystal-orientation peak intensities of Miller index <211>: <110>of 0.5:1 or less.

Clause 8. The thin-film transistor defined in Clause 6 or Clause 7, wherein the preferred crystallite orientation of Miller index <110>is determined by grazing-incidence x-ray diffraction on a 20-nm or 40-nm thick sample of tin-oxide film formed using the same process used to form the thin film of tin oxide.

Clause 9. The thin-film transistor defined in any one of Clauses 1-8, wherein the mobility is determined with a four-point probe.

Clause 10. A method of forming a thin-film transistor comprising: forming a thin film of tin oxide as a channel material between a source and a drain using atomic layer deposition (ALD) at a temperature in the range of from about 150° C. to about 220° C.; wherein the thin film of tin oxide has carrier concentration of less than or equal to $1.0\times10^{19}$ cm$^{-3}$ and a mobility of greater than or equal to 100 cm$^2$/V·s.

Clause 11. The method defined in Clause 10, comprising forming the thin film of tin oxide using plasma-enhanced ALD (PEALD).

Clause 12. The method defined in Clause 11, wherein the PEALD incudes tetraallyltin as precursor and oxygen plasma as reactant.

Clause 13. The method defined in any one of Clauses 10-12, further comprising introducing chlorine to the thin film of tin oxide.

Clause 14. The method defined in any one of Clauses 10-12, further comprising introducing fluorine to the thin film of tin oxide.

Clause 15. The method defined in any one of Clauses 10-14, further comprising introducing nitrogen to the thin film of tin oxide.

Clause 16. The method defined in any one of Clauses 10-15, further comprising annealing the thin film of tin oxide.

Clause 17. The method defined in any one of Clauses 10-16, wherein the annealing is performed at 400° C.

Clause 18. A thin film of tin oxide having an XRD pattern having (a) a main characteristic peak at 26.59° (20) and (b) a shoulder peak at 25° (20), wherein the intensity of (b) is less than or equal to about 35% of the intensity of (a).

Clause 19. The thin film defined in Clause 16, wherein the thin film of tin oxide has a crystallinity of greater than or equal to 80%.

Clause 20. The thin film defined in Clause 16 or Clause 17, wherein the thin film of tin oxide has a preferred crystallite orientation of Miller index <110>.

Clause 21. A method of forming a thin film comprising: forming a thin film of tin oxide using atomic layer deposition (ALD); wherein the thin film of tin oxide has carrier concentration of less than or equal to $1.0\times10^{19}$ cm$^{-3}$ and a mobility of greater than or equal to 100 cm$^2$/V·s.

Clause 22. The method defined in Clause 19, further comprising annealing the thin film of tin oxide.

EMBODIMENT #4

Various embodiments of Preferred Embodiment #4 of the present disclosure are described in the following numbered clauses:

Clause 1. A thin-film transistor comprising: a substrate; a source disposed at the substrate; a drain disposed at the substrate; a gate; and a thin film of tin oxide disposed within the influence of the gate between the source and the drain, the thin film of tin oxide to form a carrier channel between the source and the drain when sufficient voltage is applied at the gate; wherein the thin film of tin oxide as an XRD pattern substantially the same as that in FIG. 3A.

Clause 2. A thin-film transistor comprising: a substrate; a source disposed at the substrate; a drain disposed at the substrate; a gate; and a thin film of tin oxide disposed within the influence of the gate between the source and the drain, the thin film of tin oxide to form a carrier channel between the source and the drain when sufficient voltage is applied at the gate; wherein the thin film of tin oxide as an XRD pattern substantially the same as that in FIG. 3B.

Clause 3. The thin-film transistor defined in Clause 1 or Clause 2, wherein the thin film of tin oxide has carrier concentration of less than or equal to $1.0\times10^{19}$ cm$^{-3}$ and a mobility of greater than or equal to 100 cm$^2$/V·s.

Clause 4. The thin-film transistor defined in any one of Clauses 1-3 wherein the thin film of tin oxide has a crystallinity of greater than or equal to 80%.

Clause 5. The thin-film transistor defined in any one of Clauses 1-4, wherein the thin film of tin oxide is nanocrystalline.

Clause 6. The thin-film transistor defined in any one of Clauses 1-5, wherein the thin film of tin oxide has a preferred crystallite orientation of Miller index <110>.

Clause 7. The thin-film transistor defined in Clause 6, wherein the thin film of tin oxide has a ratio of crystal-orientation peak intensities of Miller index <101>:<110>of 0.2:1 or less, a ratio of crystal-orientation peak intensities of Miller index <200>:<110>of 0.3:1 or less, and a ratio of crystal-orientation peak intensities of Miller index <211>:<110>of 0.5:1 or less.

Clause 8. The thin-film transistor defined in Clause 6 or Clause 7, wherein the preferred crystallite orientation of Miller index <110>is determined by grazing-incidence x-ray diffraction on a 20-nm or 40-nm thick sample of tin-oxide film formed using the same process used to form the thin film of tin oxide.

Clause 9. The thin-film transistor defined in any one of Clauses 1-8, wherein the mobility is determined with a four-point probe.

Clause 10. A method of forming the thin-film transistor defined in any one of Clauses 1-9 comprising: forming a thin film of tin oxide as a channel material between a source and a drain using atomic layer deposition (ALD) at a temperature in the range of from about 150° C. to about 220° C.; wherein the thin film of tin oxide has carrier concentration of less than or equal to $1.0\times10^{19}$ $cm^{-3}$ and a mobility of greater than or equal to 100 $cm^2/V\cdot s$.

Clause 11. The method defined in Clause 10, comprising forming the thin film of tin oxide using plasma-enhanced ALD (PEALD).

Clause 12. The method defined in Clause 11, wherein the PEALD incudes tetraallyltin as precursor and oxygen plasma as reactant.

Clause 13. The method defined in any one of Clauses 10-12, further comprising introducing chlorine to the thin film of tin oxide.

Clause 14. The method defined in any one of Clauses 10-12, further comprising introducing fluorine to the thin film of tin oxide.

Clause 15. The method defined in any one of Clauses 10-14, further comprising introducing nitrogen to the thin film of tin oxide.

Clause 16. The method defined in any one of Clauses 10-15, further comprising annealing the thin film of tin oxide.

Clause 17. The method defined in any one of Clauses 10-16, wherein the annealing is performed at 400° C.

Clause 18. A thin film of tin oxide having an XRD pattern substantially the same as that in FIG. 3A or FIG. 3B.

Clause 19. The thin film defined in Clause 16, wherein the thin film of tin oxide has a crystallinity of greater than or equal to 80%.

Clause 20. The thin film defined in Clause 16 or Clause 17, wherein the thin film of tin oxide has a preferred crystallite orientation of Miller index <110>.

Clause 21. A method of forming a thin film comprising: forming a thin film of tin oxide using atomic layer deposition (ALD); wherein the thin film of tin oxide has carrier concentration of less than or equal to $1.0\times10^{19}$ $cm^{-3}$ and a mobility of greater than or equal to 100 $cm^2/V\cdot s$.

Clause 22. The method defined in Clause 19, further comprising annealing the thin film of tin oxide.

While this disclosure has been described with reference to illustrative embodiments and examples, the description is not intended to be construed in a limiting sense. Thus, various modifications of the illustrative embodiments, as well as other embodiments of the disclosure, will be apparent to persons skilled in the art upon reference to this description. It is therefore contemplated that the appended claims will cover any such modifications or embodiments.

All publications, patents and patent applications referred to herein are incorporated by reference in their entirety to the same extent as if each individual publication, patent or patent application was specifically and individually indicated to be incorporated by reference in its entirety.

What is claimed is:

1. A thin-film transistor comprising:

a substrate;

a source disposed at the substrate;

a drain disposed at the substrate;

a gate; and a thin film consisting essentially of tin oxide ($SnO_2$) disposed within an influence of the gate between the source and the drain, the thin film consisting essentially of tin oxide ($SnO_2$) to form a carrier channel between the source and the drain when sufficient voltage is applied at the gate;

wherein the thin film consisting essentially of tin oxide ($SnO_2$) has a carrier concentration of less than or equal to $1.0\times10^{19}$ $cm^{-3}$ and a mobility of greater than or equal to 100 $cm^2/V\cdot s$.

2. The thin-film transistor defined in claim 1, wherein the thin film of tin oxide ($SnO_2$) has a crystallinity of greater than or equal to 80%.

3. The thin-film transistor defined in claim 1, wherein the thin film of tin oxide ($SnO_2$) is nanocrystalline.

4. The thin-film transistor defined in claim 1, wherein the thin film of tin oxide ($SnO_2$) has a preferred crystallite orientation of Miller index <110>.

5. The thin-film transistor defined in claim 4, wherein the thin film of tin oxide ($SnO_2$) has a ratio of crystal-orientation peak intensities of Miller index <101>:<110> of 0.2:1 or less, a ratio of crystal-orientation peak intensities of Miller index <200>:<110> of 0.3:1 or less, and a ratio of crystal-orientation peak intensities of Miller index <211>:<110> of 0.5:1 or less.

6. The thin-film transistor defined in claim 4, wherein the preferred crystallite orientation of Miller index <110> is determined by grazing-incidence x-ray diffraction on a 20-nm or 40-nm thick sample of tin-oxide film formed using the same process used to form the thin film of tin oxide ($SnO_2$).

7. The thin-film transistor defined in claim 1, wherein the mobility is determined with a four-point probe.

8. The thin-film transistor defined in claim 1, wherein the thin film consisting essentially of tin oxide ($SnO_2$) further comprises chlorine.

9. The thin-film transistor defined in claim 1, wherein the thin film consisting essentially of tin oxide ($SnO_2$) further comprises fluorine.

10. The thin-film transistor defined in claim 1, wherein the thin film consisting essentially of tin oxide ($SnO_2$) further comprises nitrogen.

11. A thin film of tin oxide ($SnO_2$) having a carrier concentration of less than or equal to $1.0\times10^{19}$ $cm^{-3}$ and a mobility of greater than or equal to 100 $cm^2/V\cdot s$.

12. The thin film defined in claim 11, wherein the thin film of tin oxide ($SnO_2$) has a crystallinity of greater than or equal to 80%.

13. The thin film defined in claim 12, wherein the thin film of tin oxide ($SnO_2$) has a preferred crystallite orientation of Miller index <110>.

* * * * *